(12) United States Patent
Vermeersch et al.

(10) Patent No.: US 7,307,498 B2
(45) Date of Patent: Dec. 11, 2007

(54) ELECTRICAL CONNECTOR TEST FIXTURE

(75) Inventors: Dean Camiel William Vermeersch, Harrisburg, PA (US); Thinh Phuc Nguyen, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 141 days.

(21) Appl. No.: 11/017,459

(22) Filed: Dec. 20, 2004

(65) Prior Publication Data

US 2006/0132256 A1 Jun. 22, 2006

(51) Int. Cl.
*H01P 1/04* (2006.01)

(52) U.S. Cl. .......................... 333/260; 333/246; 333/1

(58) Field of Classification Search ............... 333/260, 333/246, 4, 5, 1
See application file for complete search history.

(56) References Cited

U.S. PATENT DOCUMENTS

| 6,255,582 | B1 | 7/2001 | Miller et al. |
| 6,290,532 | B1 * | 9/2001 | Vermeersch et al. ........ 439/460 |
| 6,384,341 | B1 * | 5/2002 | Rothermel et al. ......... 174/255 |
| 6,431,887 | B1 | 8/2002 | Yeomans et al. |
| 6,617,939 | B1 | 9/2003 | Vermeersch |
| 6,795,743 | B1 * | 9/2004 | Bell et al. ................... 700/115 |
| 2005/0213994 | A1 * | 9/2005 | Dudek et al. ............... 398/202 |

* cited by examiner

*Primary Examiner*—Stephen E. Jones

(57) ABSTRACT

A test fixture configured to receive an electrical connector is provided that includes a circuit board having a mounting area configured to be joined to an electrical connector. The circuit board has at least two layers. Contacts are provided on the circuit board, and traces extend from the contacts, wherein traces joined to adjacent contacts are distributed between the at least two layers.

16 Claims, 3 Drawing Sheets

ELECTRICAL CONNECTOR TEST FIXTURE

BACKGROUND OF THE INVENTION

This invention relates generally to electrical connectors, and more particularly, to test fixtures for electrical connectors.

Modern electronics use test fixtures to test high frequency and high speed electrical connectors. Conventional test fixtures typically include printed circuit boards that are electrically coupled to the electrical connectors. Due to continuing trends toward miniaturization, test fixtures typically utilize surface mount technology to accommodate the high density of contacts on today's electrical connectors. With surface mounting, signal contacts located on the printed circuit board can be closely spaced, thereby allowing more contacts to be mounted in the same area of the board. As such, signal contacts are placed in close proximity to one another, thereby leading to the potential for cross talk between neighboring signal contacts. Signal conductor pads, or contact fingers, located on the electrical connector, are coupled to the test fixture signal contacts and transmit data across the test fixture circuit boards along traces extending from the signal contacts.

Today, many connectors carry signals arranged in differential pairs. Hence, the test fixtures are configured to test operation of such connectors while conveying differential pairs. Known test fixtures include shielding or ground pads between traces associated with adjacent differential pairs to reduce cross talk therebetween. However, once the traces extend beyond the ground pads, an area exists in which a large amount of cross talk is created due to the close spacing and large number of traces. Thus, certain problems remain in connection with ensuring and measuring the signal integrity and the accuracy of test measurements.

BRIEF DESCRIPTION OF THE INVENTION

In accordance with an embodiment of the present invention, a test fixture configured to receive an electrical connector has been developed that includes a circuit board having a mounting area configured to be joined to an electrical connector. The circuit board has at least two layers. Contacts are provided on the circuit board, and traces extend from the contacts, wherein traces joined to adjacent contacts are distributed between at least two layers. The printed circuit board may constitute a multi-layered printed circuit board. Optionally, the printed circuit board may constitute a co-planar waveguide printed circuit board.

Certain embodiments of the present invention may also include contacts arranged in differential pairs wherein traces associated with adjacent differential pairs are located on different layers of a circuit board carrying the contacts. Alternatively, the traces may be arranged in differential pairs, wherein the traces of successive differential pairs may be routed to opposite sides of the circuit board. Furthermore, the traces may be arranged along a generally arcuate path. Optionally, the traces may have equal length.

DETAILED DESCRIPTION OF THE INVENTION

Figure 1:
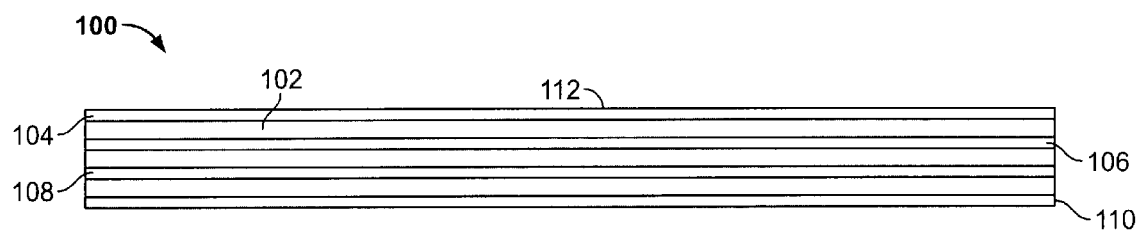
FIG. 1 illustrates a cross-sectional view of a test fixture formed in accordance with an embodiment of the present invention.

FIG. 1 illustrates a cross-sectional view of a test fixture 100 formed in accordance with an embodiment of the present invention. The test fixture 100 includes a body 102 having multiple layers. In one embodiment, the test fixture 100 is a multi-layered printed circuit board. The test fixture 100 includes a top signal layer 104, a top ground layer 106, a bottom signal layer 108 and a bottom ground layer 110. The top signal layer 104 includes a component side 112 located on the outer perimeter of the test fixture 100, to which, electrical components (e.g. connectors) are mounted or otherwise attached. The top ground layer 106 is coupled to the opposite side of the top signal layer 104 as the component side 112. The bottom signal layer 108 is then coupled to the opposing side of the top ground layer 106, and the bottom ground layer 110 is coupled to the opposing side of the bottom signal layer 108. Accordingly, the test fixture 100 includes a signal layer, a ground layer, a signal layer, and then another ground layer in parallel with one another. Optionally, the test fixture 100 may include more or less than two signal layers, and more or less than two ground layers. Alternatively, the test fixture 100 may be a co-planar waveguide printed circuit board.

Figure 2:
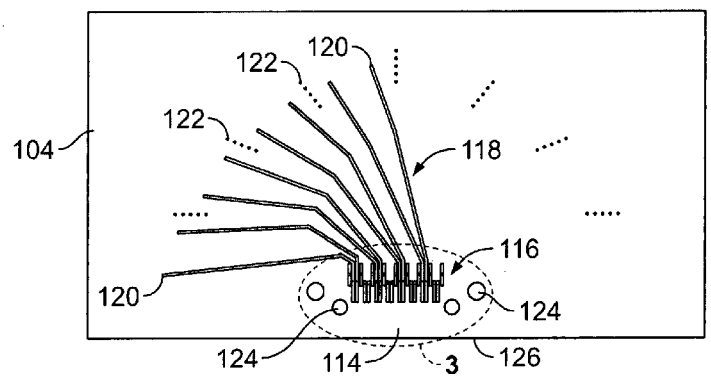
FIG. 2 illustrates a top view of a portion of the test fixture shown in FIG. 1.

FIG. 2 illustrates a top view of the top signal layer 104 including a mounting area 114 that is configured to be joined to an electrical connector, or receptacle, (not shown) for testing. Specifically, mounting area 114 includes a plurality of contacts 116, such as, but not limited to, metal contacts, for interfacing with or otherwise electrically connecting the electrical connector to the test fixture 100.

The top signal layer 104 includes a plurality of traces 118 that extend outwardly from the contacts 116 towards the outer perimeter of the test fixture 100. The traces 118 terminate at respective test device vias 120 that are oriented to connect with a test device (not shown) when coupled to the test fixture 100. The traces 118 are oriented on the top signal layer 104 to reduce the occurrence of cross-talk between the respective traces 118. Optionally, the traces 118 may be substantially equally spaced in an arcuate pattern so as to provide a reduction in cross-talk between neighboring traces 118. Furthermore, the test device vias 120 may be oriented on the top signal layer 104 in an arcuate path such that each of the traces 118 have a substantially equal length. Optionally, the top signal layer 104 may include a plurality of picket fence ground vias 122 arranged in a row and positioned between the traces 118. The picket fence ground vias 122 are connected to a ground layer, such as top ground layer 106, and facilitate reducing cross talk between adjacent traces 118. Moreover, the top signal layer 104 includes a plurality of alignment holes 124 positioned proximate to a connector edge 126 of the test fixture 100 and that extend through each of the layers 104-110. The alignment holes 124 facilitate aligning the electrical connector with the test fixture 100.

Figure 3:
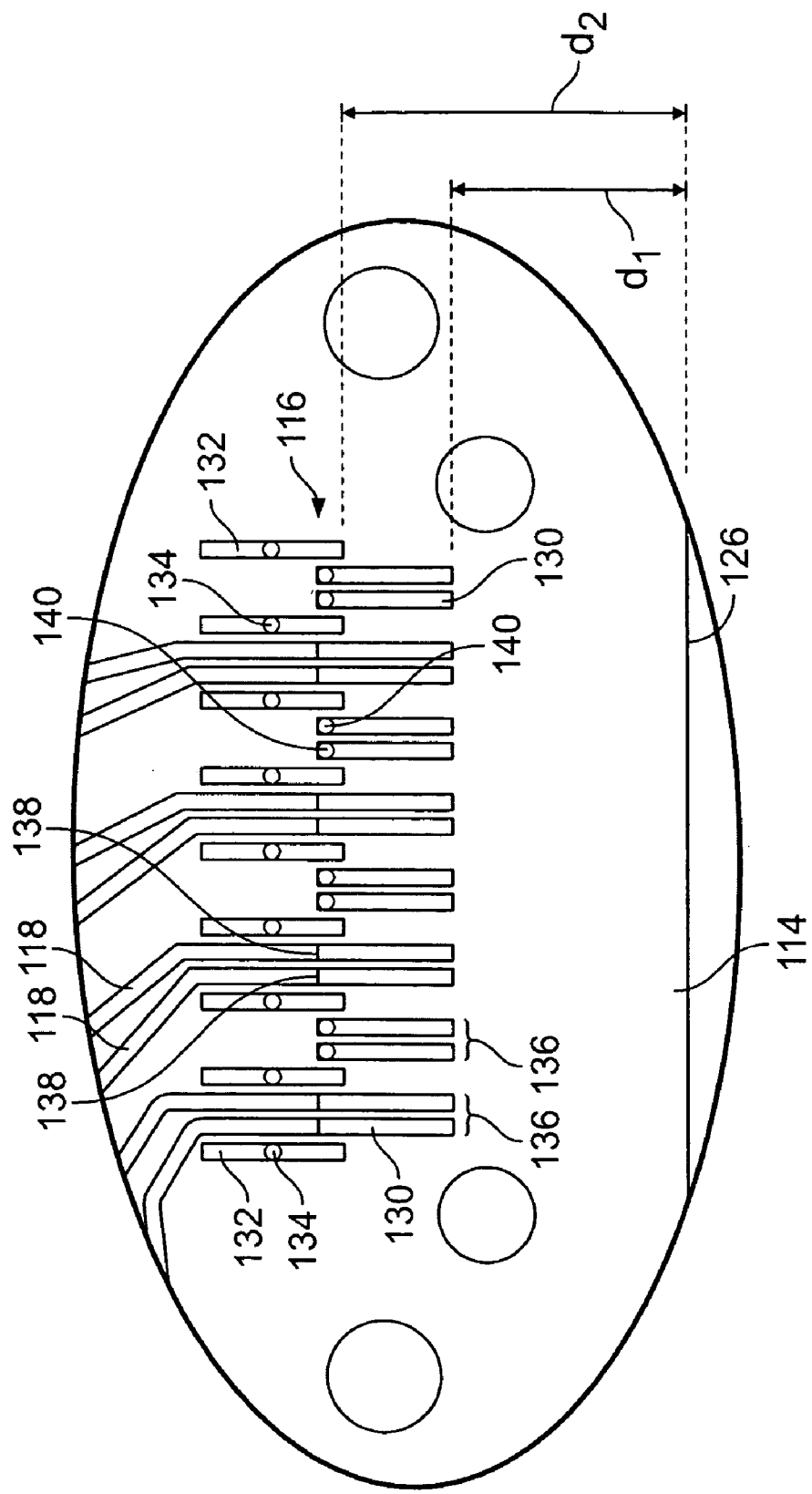
FIG. 3 illustrates a top view of an enlarged portion of the test fixture shown in FIG. 2.

FIG. 3 illustrates an enlarged view of the mounting area 114 of the top signal layer 104 shown in FIG. 2. In FIG. 3, the contacts 116 includes both a plurality of surface mounted signal pads 130 and a plurality of surface mounted ground blades 132 that are positioned on the top signal layer 104. The configuration of signal pads 130 and ground blades 132 along the top signal layer 104 may be varied, provided that the configuration does not afford undue reflection, signal interference or cross talk. In one embodiment, the signal pads 130 are positioned a distance $d_1$ from the connector edge 126 and are generally aligned with one another as a single row. The ground blades 132 are positioned a distance $d_2$ from the connector edge 126 and are generally aligned with one another as a single row. The distance $d_2$ is greater than the distance $d_1$ such that the ground blades 132 are offset with respect to the signal pads 130 to enhance accessibility of the signal pads 130. Alternatively, the signal pads 130 or the ground blades 132 may be staggered with respect to one another such that the signal pads 130 or the ground blades 132 are not in single rows. The ground blades 132 each include a ground via 134 extending through the respective ground blade 132 and the top signal layer 104 to the top ground layer 106. The ground vias 134 are aligned with one another and are substantially centered with respect to the ground blades 132. Alternatively, the ground vias 134 are off set with respect to one another.

In an exemplary embodiment, signals are transmitted between the electrical connector and the test fixture 100 through the connection at the signal pads 130. The signals have a single ended arrangement such that each signal is independent from each other signal and can function without the need of any other signal having an opposite voltage to balance the electromagnetic fields created by the individual signals. Optionally, two signals may be oriented and arranged to function as a differential pair 136. As such, two single ended signals may be coupled differentially by sending equal but opposite signals through two separate signal pads 130. Furthermore, due to the single ended nature of the signals, the separate signals of the differential pair 136 can be transmitted from any location on the test fixture 100. However, as illustrated in FIG. 3, adjacent signal pads 130 are arranged as a differential pair 136. Furthermore, each differential pair 136 is separated by a ground blade 132.

As illustrated in FIG. 3, the traces 118 coupled to the top signal layer 104 are coupled to an end 138 of the respective signal pads 130. Specifically, the traces 118 are coupled to the signal pads 130 of alternating differential pairs 136 such that traces 118 associated with adjacent differential pairs 136 are located on different signal layers, such as the top signal layer 104 and the bottom signal layer 108, as will be described in detail below. Moreover, the signals that are transmitted along the signal pads 130 that are not coupled to the traces 118 are through hole mounted to the test fixture 100. Specifically, routing vias 140 extend from the top signal layer 104 to the bottom signal layer 106 (FIG. 1), and the signals transmitted by the signal pads 130 having the routing vias 140 are routed to the bottom signal layer 108. Accordingly, the signals are distributed between the top signal layer 104 and the bottom signal layer 108.

Figure 4:
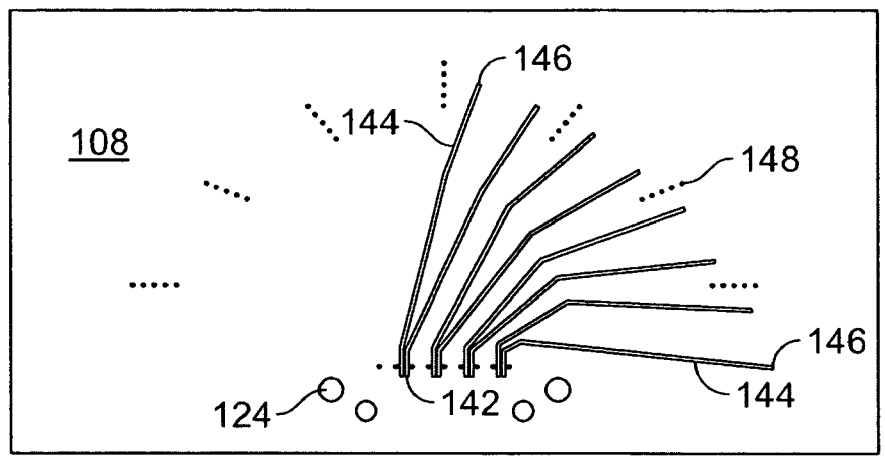
FIG. 4 illustrates a top view of a portion of the test fixture shown in FIG. 1.

FIG. 4 illustrates a top view of the bottom signal layer 108 including a plurality of routing vias 142 that are associated with the routing vias 140 located on the top signal layer 104 (FIG. 3). Specifically, the signals that are routed through the test figure 100 are electrically coupled between the top signal layer 104 and the bottom signal layer 108 by the routing vias 140 and 142.

Furthermore, the bottom signal layer 108 includes a plurality of traces 144 that are electrically and mechanically coupled to the routing vias 142 and that extend outwardly from the routing vias 142 towards the outer perimeter of the test fixture 100. The traces 144 terminate at a respective test device via 146 that extends from the bottom signal layer 108 and is oriented to connect with the test device (not shown) when coupled to the test fixture 100. The traces 144 are oriented on the bottom signal layer 110 to reduce the occurrence of cross-talk between the respective traces 144. Optionally, the traces 144 may be substantially equally spaced in an arcuate pattern so as to provide a reduction in cross-talk between neighboring traces 144. Furthermore, the test device vias 146 may be oriented on the bottom signal layer 110 in an arcuate path such that the traces 144 each have a substantially equal length. Optionally, the bottom signal layer 110 may include a plurality of picket fence ground vias 148 arranged in a row and positioned between the traces 144 of respective differential pairs. The picket fence ground vias 148 facilitate reducing cross talk between adjacent differential pairs. Moreover, the plurality of alignment holes 124 extend through the bottom signal layer 108.

In an exemplary embodiment, the signals transmitted on the traces 144 have a single ended arrangement such that each signal is independent from each other signal and can function without the need of any other signal having an opposite voltage to balance the electromagnetic fields created by the individual signals. Optionally, adjacent traces may be oriented and arranged to function as a differential pair, such as the differential pairs 136 shown in FIG. 3. As such, two single ended signals may be coupled differentially by sending equal but opposite signals on two separate traces 144. Furthermore, due to the single ended nature of the signals, the separate signals of the differential pair 136 can be transmitted from any location on the circuit board. However, as illustrated in FIG. 4, adjacent traces 144 have a differential pair arrangement.

Figure 5:
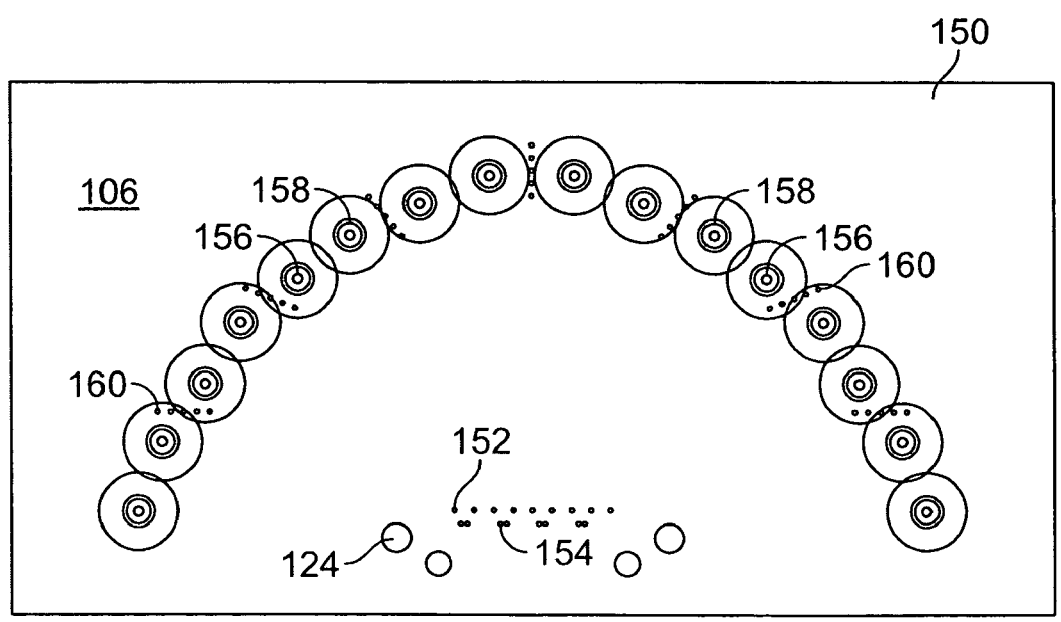
FIG. 5 illustrates a top view of a portion of the test fixture shown in FIG. 1.

FIG. 5 illustrates a top view of a ground layer, such as top ground layer 106 or bottom ground layer 110. While the ground layer shown in FIG. 5 is described and illustrated in the context of the top ground layer 106, it is recognized that the top and bottom ground layers 106 and 110 are substantially similar. Alternatively, top and bottom ground layers 106 and 110 may not be similar, depending on the configuration of the respective traces 118 and 144.

The top ground layer 106 includes a ground surface 150 and a plurality of ground vias 152. The ground vias 152 are substantially aligned with the ground vias 134 associated with the top signal layer 104 (FIG. 3). The ground vias 152 transfer the ground signal from the ground blades 132 to the ground surface 150 of the top ground layer 106. The top ground layer 106 also includes a plurality of routing vias 154 that are substantially aligned with the routing vias 140 and 142 (FIGS. 3 and 4) associated with the top and bottom signal layers 104 and 108, respectively. The routing vias 154 facilitate transferring the signal from the top signal layer 104 to the bottom signal layer 108.

The top ground layer 106 includes a plurality of test device vias 156 that are aligned with the test device vias 120 and 146 of the top and bottom signal layers 104 and 108, respectively. The test device vias 156 are insulated from the ground layer by an insulating surface 158. Optionally, the top ground layer 106 may include a plurality of picket fence ground vias 160 arranged in a row and positioned between the traces of respective differential pairs. The picket fence ground vias 160 facilitate reducing cross talk between adjacent differential pairs.

In operation, an electrical connector to be tested is coupled to the component side 112 of the top signal layer 104 at the mounting area 114. Specifically, the alignment pins (not shown) extending from the electrical connector are inserted into the alignment holes 124 of the test fixture 100.

Signals are transmitted between the electrical connector and the test fixture through the signal pads 130. The signals are then transmitted to the test device vias 120 and 146 by the traces 118 and 144, respectively. As such, the test fixture 100 utilizes both surface mounting and through hole mounting of traces 118 and 144 to transmit the signals. A test device (not shown) is then coupled to the test fixture 100 to test the signal characteristics, such as, but not limited to, cross talk, impedance, jitter, and the like.

Each of the signals is single ended. As such, each trace carries an independent signal and can function without the need of any other signal having an opposite voltage to balance the electromagnetic fields created by the individual signals. Furthermore, the top and bottom ground layers 106 and 110 provide the single ended coupling of each signal due to the close coupling of the traces 118 and 144 to the respective ground layer 106 and 110. Specifically, the electromagnetic fields of each signal are constrained between the traces 118 and 144 and the ground layers 106 and 110. As such, traces 118 or 144 can be located in close proximity to other traces 118 or 144 and not be located within the primary fields of one another. Therefore coupling and cross talk is limited between the fields. However, in use, two single ended signals are coupled differentially by sending equal but opposite signals on two separate traces 118 or 144. Furthermore, due to the single ended nature of the signals, the separate signals of each differential pair 136 can be transmitted from any location on the circuit board. As such, the test fixture 100 may have any trace arrangement and via configuration desired. Moreover, due to the through hole mounting of a portion of the signal traces 144 onto a separate layer as the surface mounted traces 118, the respective traces 144 and 118 can be oriented to reduce cross talk. Specifically, the traces 144 and 118 can be further spread out than if all of the traces 144 and 118 were mounted on the same signal layer 104 or 108.

The above-described embodiments provide a cost effective and reliable means for developing a test fixture 100 for electrical connectors. Specifically, the test fixture 100 includes a body 102, such as a printed circuit board, having multiple layers, such as signal layers 104 or 108 and ground layers 106 or 110 inter-disposed with one another. Moreover, the test fixture 100 combines both surface mounting and through hole mounting of traces 118 and 144, respectively. Accordingly, traces 118 and 144 associated with adjacent differential pairs 136 of contacts are located on different signal layers 104 or 108. As a result, cross talk between the trace signals is reduced and the test fixture 100 can more accurately test the electrical connector.

Exemplary embodiments of test fixtures 100 are described above in detail. The test fixtures 100 are not limited to the specific embodiments described herein, but rather, components of each test fixture 100 may be utilized independently and separately from other components described herein. For example, each test fixture 100 component can also be used in combination with other test fixture 100 components.

While the invention has been described in terms of various specific embodiments, those skilled in the art will recognize that the invention can be practiced with modification within the spirit and scope of the claims.

What is claimed is:

1. A test fixture configured to receive an electrical connector, comprising:
    a multilayer circuit board having a mounting area configured to be joined to an electrical connector, said circuit board having signal layers separated by a ground layer;
    contacts provided on said circuit board at said mounting area; and
    traces extending from said contacts, wherein said traces are distributed between said signal layers, said traces being arranged on the respective signal layers in a generally arcuate pattern, said traces terminating at test device vias that are configured to engage a test device while the electrical connector is joined to said mounting area for testing the electrical connector using the test device, said test device vias being arranged on the respective signal layers in a generally arcuate pattern.

2. The test fixture of claim 1, further comprising the test device engaged with the test device vias.

3. The test fixture of claim 1, wherein said circuit board constitutes a co-planar waveguide printed circuit board.

4. The test fixture of claim 1, wherein contacts are one of surface mount and throughholes.

5. The test fixture of claim 1, wherein said contacts are arranged in differential pairs and traces associated with adjacent differential pairs of said contacts are located on different ones of said signal layers.

6. The test fixture of claim 1, wherein said traces are arranged in differential pairs, said traces of successive differential pairs being routed to opposite sides of said circuit board.

7. The test fixture of claim 1, wherein said traces convey one of differential pair and single-ended application signals.

8. The test fixture of claim 1, wherein said traces all have equal length.

9. A test fixture configured to receive an electrical connector, comprising:
    a multilayer body having a mounting area configured to be joined to an electrical connector, said body having signal layers separated by a ground layer;
    contacts provided on said body at said mounting area; and
    traces extending from said contacts, wherein said traces are distributed between said signal layers, said traces being arranged on the respective signal layers in a generally arcuate pattern, said traces terminating at test device vias that are configured to engage a test device while the electrical connector is joined to said mounting area for testing the electrical connector using the test device, said test device vias being arranged on the respective signal layers in a generally arcuate pattern.

10. The test fixture of claim 9, wherein said traces convey one of differential pair and single-ended application signals.

11. The test fixture of claim 9, wherein said traces all have equal length.

12. The test fixture of claim 9, further comprising the test device engaged with the test device vias.

13. The test fixture of claim 9, wherein said body constitutes a co-planar waveguide printed circuit board.

14. The test fixture of claim 9, wherein contacts are one of surface mount and throughholes.

15. The test fixture of claim 9, wherein said contacts are arranged in differential pairs and traces associated with adjacent differential pairs of said contacts are located on different ones of said signal layers.

16. The test fixture of claim 9, wherein said traces are arranged in differential pairs, said traces of successive differential pairs being routed to opposite sides of said body.

* * * * *